(12) United States Patent
Chang et al.

(10) Patent No.: US 9,385,034 B2
(45) Date of Patent: Jul. 5, 2016

(54) CARBONIZATION OF METAL CAPS

(75) Inventors: Hui-Lin Chang, Hsin-Chu (TW);
Ting-Yu Shen, JiJi Town (TW);
Yung-Cheng Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2549 days.

(21) Appl. No.: 11/786,367

(22) Filed: Apr. 11, 2007

(65) Prior Publication Data
US 2008/0251928 A1 Oct. 16, 2008

(51) Int. Cl.
| H01L 23/48 | (2006.01) |
| H01L 23/52 | (2006.01) |
| H01L 29/40 | (2006.01) |
| H01L 21/768 | (2006.01) |

(52) U.S. Cl.
CPC .... H01L 21/76849 (2013.01); H01L 21/76856 (2013.01); H01L 21/76883 (2013.01)

(58) Field of Classification Search
USPC .......... 257/758, E21.579, 751, 760, 762, 764, 257/769, 775
See application file for complete search history.

(56) References Cited

U.S. PATENT DOCUMENTS

| | | | |
|---|---|---|---|
| 4,502,209 A * | 3/1985 | Eizenberg et al. ............ 438/653 |
| 4,920,071 A * | 4/1990 | Thomas ........................ 438/626 |
| 5,510,651 A * | 4/1996 | Maniar ............... H01L 23/5226 257/295 |
| 5,851,680 A * | 12/1998 | Heau ............................ 428/472 |
| 6,297,159 B1 * | 10/2001 | Paton ........................... 438/693 |
| 6,686,662 B2 * | 2/2004 | Merchant et al. ............ 257/751 |
| 7,026,714 B2 * | 4/2006 | Cunningham .... H01L 21/76805 257/751 |
| 7,235,884 B1 * | 6/2007 | McElheny et al. ............ 257/762 |
| 7,300,868 B2 * | 11/2007 | Fukasawa ......... H01L 21/76807 257/E21.577 |
| 7,351,655 B2 * | 4/2008 | Cunningham .... H01L 21/76805 257/E21.584 |
| 2002/0050647 A1 * | 5/2002 | Ikegami et al. ............... 257/762 |
| 2004/0127016 A1 * | 7/2004 | Hoog et al. .................... 438/637 |
| 2004/0238961 A1 * | 12/2004 | Cunningham .... H01L 21/76805 257/758 |
| 2005/0147762 A1 | 7/2005 | Dubin et al. |
| 2005/0148202 A1 * | 7/2005 | Heiliger et al. ............... 438/778 |
| 2006/0051882 A1 * | 3/2006 | Doczy et al. ..................... 438/3 |
| 2006/0163739 A1 * | 7/2006 | Komai et al. ................. 257/762 |
| 2006/0175708 A1 * | 8/2006 | Ueno ............................ 257/774 |
| 2006/0216929 A1 * | 9/2006 | Park et al. ..................... 438/637 |
| 2007/0075427 A1 * | 4/2007 | Lavoie et al. ................. 257/750 |
| 2007/0184651 A1 * | 8/2007 | Cunningham .... H01L 21/76805 438/637 |
| 2007/0228571 A1 * | 10/2007 | Yu et al. ........................ 257/758 |
| 2007/0231993 A1 * | 10/2007 | Fukasawa ......... H01L 21/76807 438/231 |

* cited by examiner

*Primary Examiner* — Telly Green
(74) *Attorney, Agent, or Firm* — Slater Matsil, LLP (57) ABSTRACT

An integrated circuit structure includes a semiconductor substrate; a dielectric layer over the semiconductor substrate; a conductive wiring in the dielectric layer; and a metal carbide cap layer over the conductive wiring.

20 Claims, 7 Drawing Sheets

CARBONIZATION OF METAL CAPS

TECHNICAL FIELD

This invention is related generally to integrated circuits, and more particularly to structures and formation methods of interconnect structures, and even more particularly to the formation of caps on copper features.

BACKGROUND

A commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys to form a via or a trench. Excess metal material on the surface of the dielectric layer is then removed by chemical mechanical polish (CMP). The remaining copper or copper alloy forms vias and/or metal lines.

Copper has replaced aluminum because of its lower resistivity. However, copper still suffers from electro migration (EM) and stress migration (SM) reliability issues as geometries continue to shrink and current densities increase.

Figure 1:
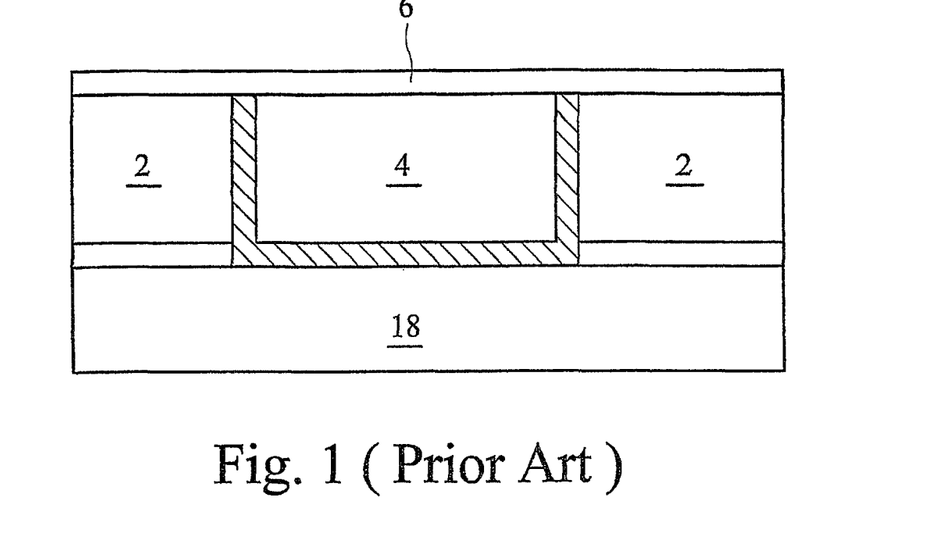
FIG. 1 illustrates a conventional interconnect structure in a low-k dielectric layer, wherein an etch stop layer is formed on a copper line.

FIG. 1 illustrates a cross-sectional view of an intermediate stage in the formation of a conventional interconnect structure. Copper line 4 is formed in low-k dielectric layer 2. Etch stop layer (ESL) 6 is formed on the top surface of copper line 4 and low-k dielectric layer 2. A shortcoming of the structure shown in FIG. 1 is the degradation in RC delay. ESL 6 typically has a higher dielectric constant (k value) than low-k dielectric layer 2. As a result, the parasitic capacitances between the metal lines are increased, which results in the increase in RC delay.

Figure 2:
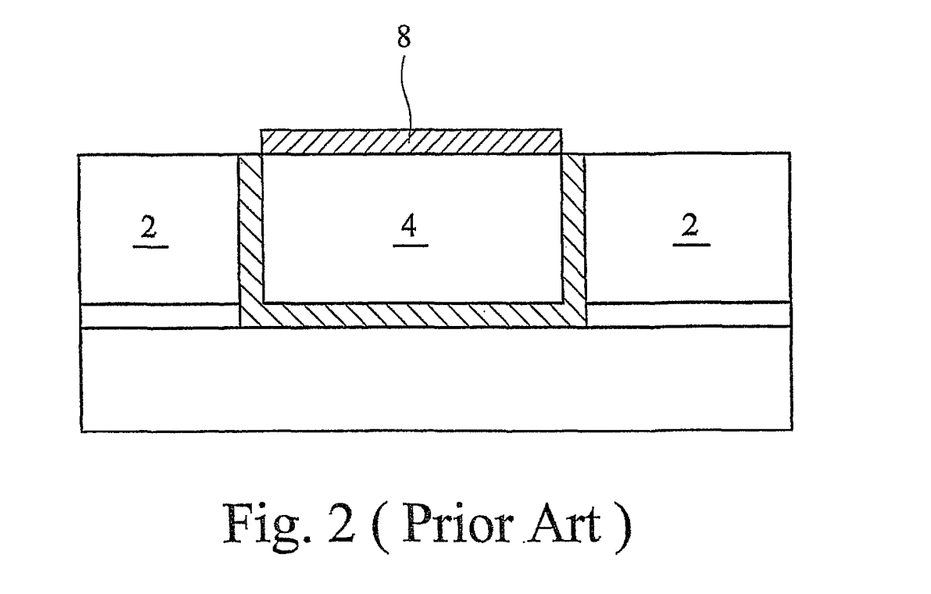
FIG. 2 illustrates a conventional interconnect structure in a low-k dielectric layer, wherein a metal cap layer is formed on a copper line.

FIG. 2 illustrates an improved interconnect structure, wherein metal cap 8 is formed on copper line 4. Metal cap 8 is typically formed of materials suffering less from electromigration and stress-migration, for example, CoWP, tantalum, titanium, tungsten, and combinations thereof. This layer improves the reliability of the interconnect structure by reducing copper surface migration. It has been found that under stressed conditions, the mean time to failure (MTTF) of the interconnect structures with metal caps may be ten times greater than that of the interconnect structure shown in FIG. 1. With metal cap 8, the stress-induced void formation is significantly reduced. Additionally, parasitic capacitances are also reduced.

The structures shown in FIGS. 1 and 2 suffer from drawbacks. Copper line 4 and metal cap 8 are typically vulnerable to oxygen and/or chemical attacks, wherein oxygen and chemicals are introduced in the subsequent formation of the overlying low-k dielectric layers, etch stop layers, and the like. As a result, the contact resistance between copper line 4 and the overlying vias (not shown) is increased. This may also cause yield loss. Therefore, new structures and formation methods that overcome the deficiencies of the prior art are needed.

SUMMARY OF THE INVENTION

In accordance with one aspect of the present invention, an integrated circuit structure includes a semiconductor substrate; a dielectric layer over the semiconductor substrate; a conductive wiring in the dielectric layer; and a metal carbide cap layer over the conductive wiring.

In accordance with another aspect of the present invention, an integrated circuit structure includes a substrate; a low-k dielectric layer over the substrate; an opening extending from a top surface of the low-k dielectric layer into the low-k dielectric layer; a barrier layer lining the opening; a copper-containing conductive line in the opening and on the barrier layer; and a metal carbide layer over the copper-containing conductive line.

In accordance with yet another aspect of the present invention, an integrated circuit structure includes a semiconductor substrate; a dielectric layer over the semiconductor substrate; a copper line in the dielectric layer; a metal cap layer on the copper line; and a metal carbonitride layer on the metal cap layer. The metal cap layer and the metal carbonitride layer include same metals.

In accordance with yet another aspect of the present invention, a method for forming a semiconductor structure includes providing a semiconductor substrate; forming a first dielectric layer over the semiconductor substrate; forming a conductive wiring in the first dielectric layer; and forming a metal carbide cap layer over the conductive wiring.

In accordance with yet another aspect of the present invention, a method for forming a semiconductor structure includes providing a semiconductor substrate; forming a low-k dielectric layer over the semiconductor substrate; forming an opening extending from a top surface of the low-k dielectric layer into the low-k dielectric layer; forming a copper-containing conductive line in the opening; forming a metal cap layer on the copper-containing conductive line; and carbonizing a top portion of the metal cap layer to form a metal carbide cap layer, wherein a bottom portion of the metal cap layer is un-carbonized.

The advantageous features of the present invention include improved stability of the contacts between copper lines and vias, reduced parasitic capacitance, reduced leakage current, and improved bondability between caps and the overlying dielectric layers.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 through 8B are cross-sectional views of intermediate stages in the manufacturing of embodiments of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Interconnect structures comprising metal carbide layers and methods of forming the same are provided. The intermediate stages of manufacturing preferred embodiments of the present invention are illustrated in FIGS. 3 through 8B. Variations are then discussed. Throughout various views and illustrative embodiments of the present invention, like reference numbers are used to designate like elements.

Figure 3:
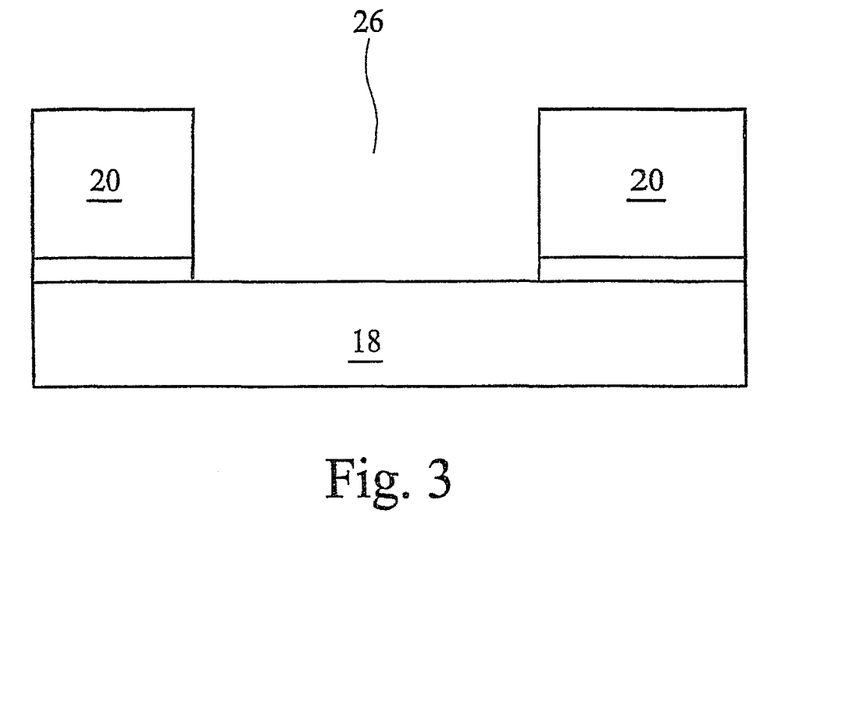

FIG. 3 illustrates the formation of opening 26 in dielectric layer 20, which is formed over a schematically illustrated base structure 18. Base structure 18 may include a semiconductor substrate and overlying layers such as contact etch stop layer, inter-layer dielectric, and inter-metal dielectrics (not shown). The semiconductor substrate may be a single crystalline or a compound semiconductor substrate. Active devices (not shown), such as transistors, may be formed on the semiconductor substrate. Opening 26 may be a trench for forming a metal line. In an exemplary embodiment, dielectric layer 20 has a low dielectric constant (k value), preferably lower than about 3.0, hence is referred to as low-k dielectric layer 20 throughout the description. More preferably, low-k dielectric layer 20 has a k value of less than about 2.5, and hence is sometimes referred to as an extra low-k (ELK) dielectric layer. Low-k dielectric layer 20 may include commonly used materials such as carbon-containing dielectric materials, and may further contain nitrogen, hydrogen, oxygen, and combinations thereof. A porous structure may be used for lowering the k value.

Figure 4:
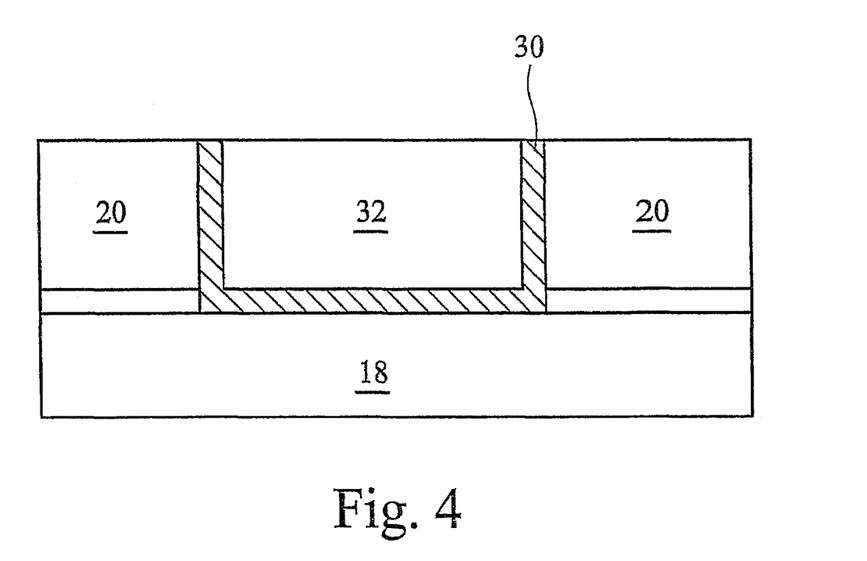

FIG. 4 illustrates the formation of (diffusion) barrier layer 30 for lining opening 26, and conductive line 32 in opening 26. Barrier layer 30 preferably includes titanium, titanium nitride, tantalum, tantalum nitride, or other alternatives, and may be formed using physical vapor deposition (PVD) or one of the chemical vapor deposition (CVD) methods. The thickness of barrier layer 30 may be between about 20 Å and about 200 Å. One skilled in the art will realize, however, that the dimensions recited throughout the description are related to the technology used for forming the integrated circuits, and will reduce with the scaling of the technology.

Conductive line 32 preferably includes copper or copper alloys. Throughout the description, conductive line 32 is alternatively referred to as copper line 32, although it may include other conductive materials, such as silver, gold, tungsten, aluminum, and the like. As is known in the art, the steps for forming barrier layer 30 and copper line 32 may include blanket forming barrier layer 30; depositing a thin seed layer of copper or copper alloy on barrier layer 30; and filling opening 26 with a conductive material, such as copper, preferably by plating. A chemical mechanical polish (CMP) is then performed to remove excess conductive material, leaving only barrier layer 30 and copper line 32 in opening 26.

A pretreatment may then be performed to treat the surface of copper line 32. In the preferred embodiment, the pretreatment includes a hydrogen-based gas treatment in a production tool, such as one used for plasma enhanced chemical vapor deposition (PECVD). The hydrogen-based gases preferably include $N_2$, $NH_3$, and the like. In alternative embodiments, the pretreatment is performed in a hydrogen-based gas environment, which contains hydrogen-containing gases, such as $H_2$, $NH_3$, and the like. The pretreatment has the function of reducing native copper oxide to copper and removing chemical contamination from copper line 32.

Figure 5:
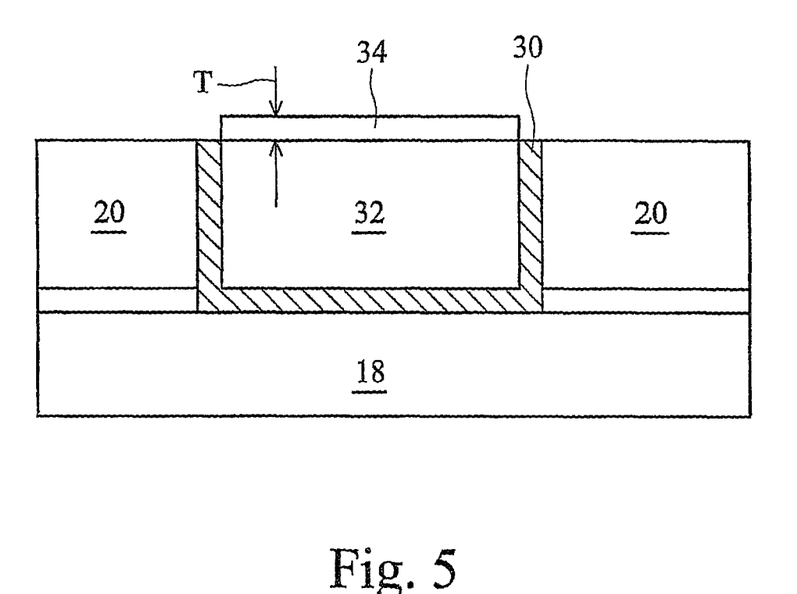

FIG. 5 illustrates the formation of metal cap 34. In the preferred embodiment, metal cap 34 includes metals having a high ability of forming bonds with carbon, silicon and/or nitrogen. Exemplary metals and compounds in metal cap 34 include iron (Fe), tungsten (W), tantalum (Ta), cobalt (Co), nickel (Ni), molybdenum (Mo), titanium (Ti), CoWP, CoB, and combinations thereof. Metal cap 34 is preferably formed selectively using electroless plating, during which the wafer including the structure shown in FIG. 4 is submerged in a plating solution. Alternatively, metal cap 34 may be blanket formed on copper line 32 and low-k dielectric layer 20, followed by etching undesirable portions. In an exemplary embodiment, thickness T of metal cap 34 is between about 25 Å and about 200 Å. Although the drawing shows that metal cap 34 only covers copper line 32, but not diffusion barrier layer 30, one skilled in the art will realized that metal cap 34 may also extend onto top edges of diffusion barrier layer 30.

Figure 6A:
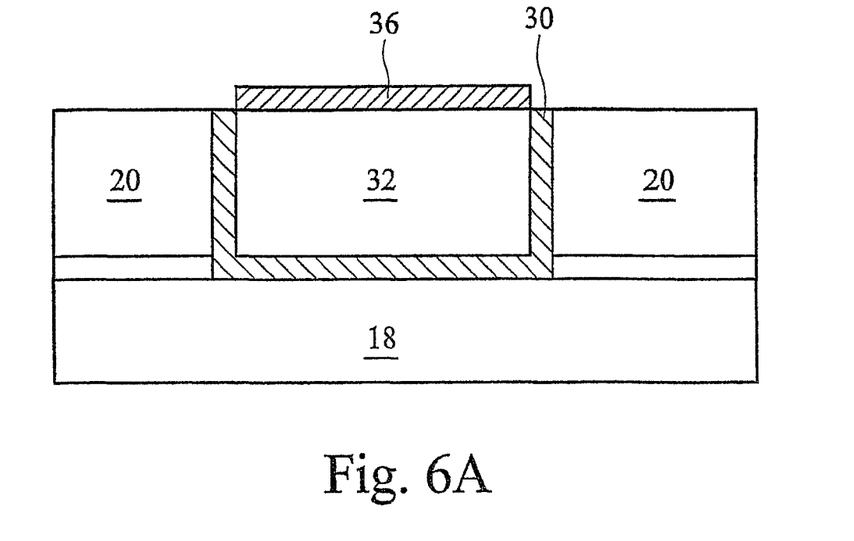
Figure 6B:
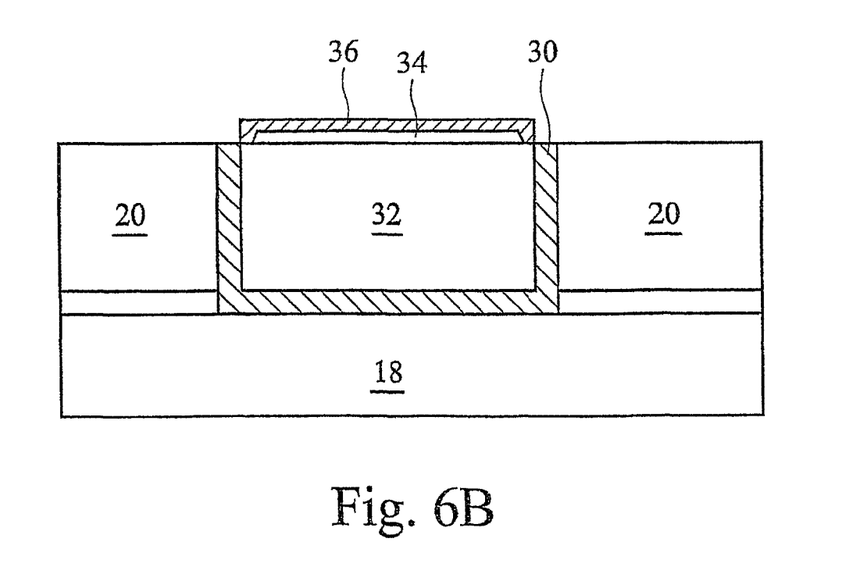

Referring to FIGS. 6A and 6B, a silicidation process is performed on metal cap 34. As a result, at least a top portion of metal cap 34 is silicided, forming silicide cap 36. In the preferred embodiment, the silicidation process involves soaking metal cap 34 in silicon-containing gases. The applicable silicon-containing gases include $SiH_4$, $Si_2H_6$, and combinations thereof. Other gases containing Si—H bonds may also be used. Preferably, the silicidation process is performed at an elevated temperature, for example, between about 250° C. and about 450° C. The duration of the silicidation is preferably between about 5 seconds and about 60 seconds, and the gas pressure is preferably between about 10 mtorr to about 760 torr. In alternative embodiments, a plasma-assisted silicidation is performed, preferably in a production tool used for CVD, wherein essentially the same silicon-containing gases may be introduced.

In FIG. 6A, metal cap 34 is fully silicided and converted into metal silicide cap 36. In a more preferred embodiment, as illustrated in FIG. 6B, a partially silicided cap, which includes metal silicide cap 36 on the remaining metal cap 34, is formed. The underlying copper line 32, however, is preferably not silicided. As is known in the art, whether the metal cap 34 is fully or partially silicided may be controlled by adjusting silicidation process conditions such as gas flow rate, temperature, duration, etc. One skilled in the art will find optimum process conditions through routine experiments.

Figure 7A:
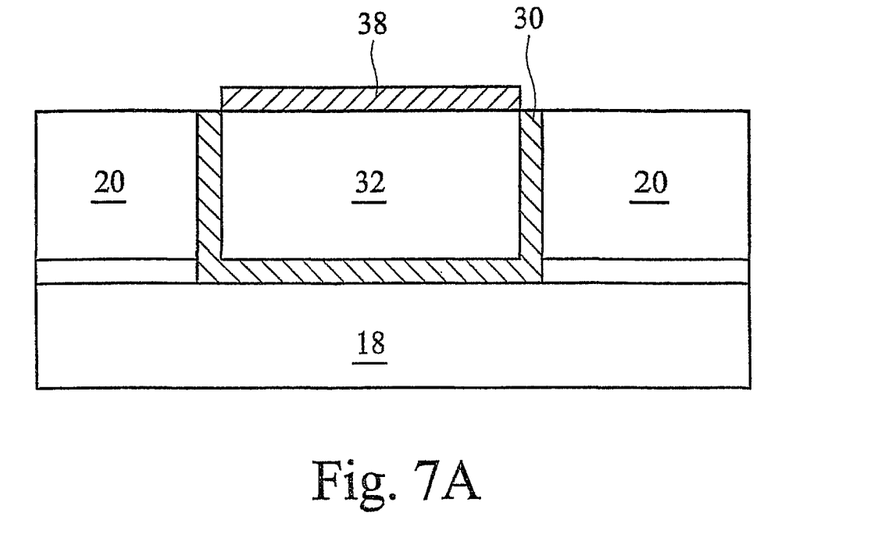

Referring to FIG. 7A, metal silicide cap 36 is carbonized to form metal silicon carbide cap 38. In the preferred embodiment, the carbonization includes a plasma treatment of metal silicon layer 36 in a carbon-containing environment. Preferably, process gases include carbon-containing gases. In an exemplary embodiment, the process gases include carbon and hydrogen containing gases $CH_x$, such as $C_2H_4$, $C_2H_6$, and combinations thereof. In an exemplary embodiment, the temperature for the carbonization is preferably between about 250° C. and about 450° C. The process duration is preferably between about 5 seconds and about 60 seconds, and the gas pressure is preferably between about 10 mtorr to about 760 torr.

In alternative embodiments, nitrogen-containing gases are added during the carbonization process. Accordingly, metal silicon carbide cap 38 is also a metal silicon carbonitride cap. In an exemplary embodiment, the process gases include both carbon-containing gases such as $CH_x$, and nitrogen-containing gases such as $N_2$, $NH_3$, and combinations thereof. Again, the temperature for the carbonization is preferably between about 250° C. and about 450° C. The process duration is preferably between about 5 seconds and about 60 seconds, and the gas pressure is preferably between about 10 mtorr to about 760 torr.

In yet other embodiments, to form metal silicon carbonitride cap 38, the carbonization and nitridation processes may be separately performed. In a first embodiment, a carbonization process is performed to form metal silicon carbide layer 38, and a nitridation process is performed to convert metal silicon carbide layer 38 into metal silicon carbonitride layer 38. In a second embodiment, the nitridation process is performed before the carbonization process.

Figure 7B:
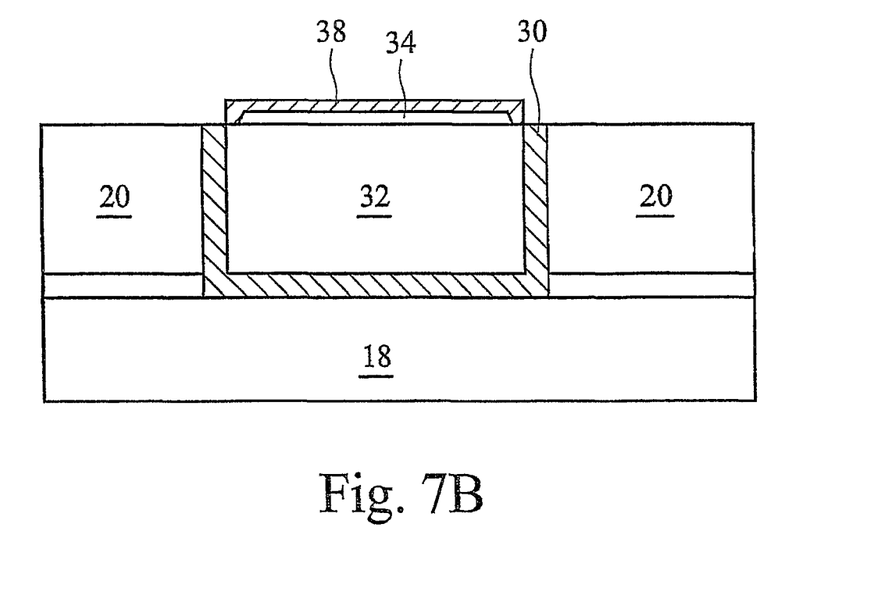

FIG. 7B illustrates a structure formed due to partial silicidation, partial carbonization, and partial nitridation. Preferably, only a top portion of metal silicide cap 36 is converted to metal silicon carbide layer 38 or metal silicon carbonitride layer 38, while the bottom portion of metal silicide cap 36 is not converted.

Figure 8A:
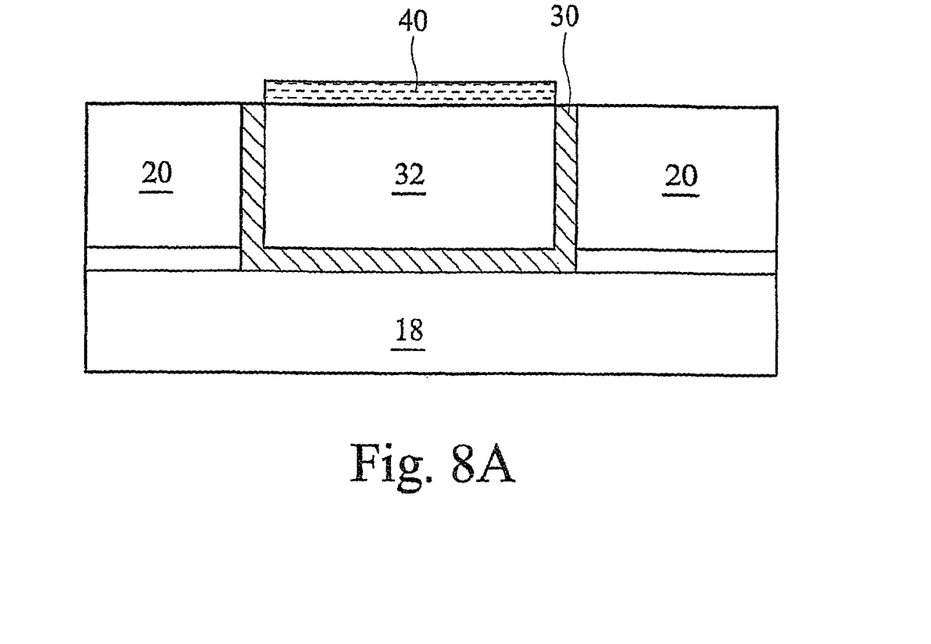
Figure 8B:
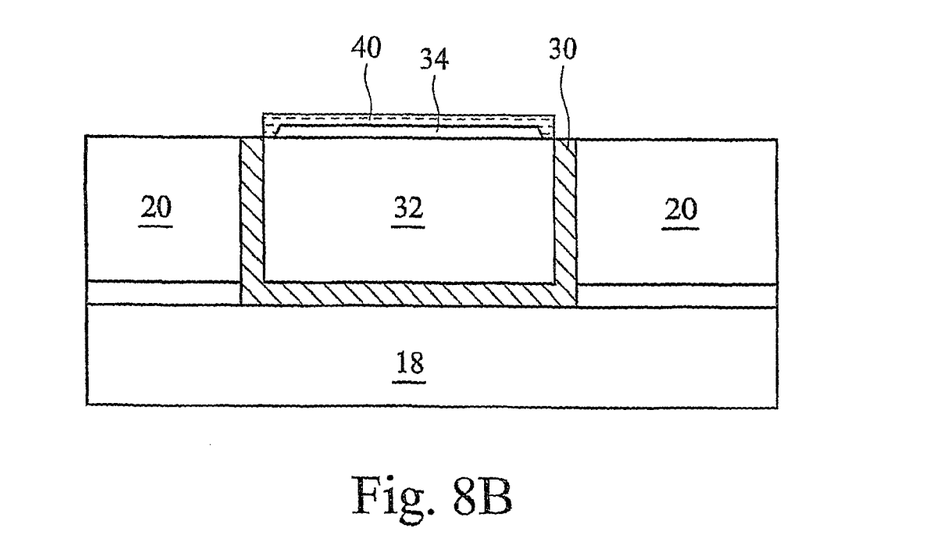

FIGS. 8A and 8B illustrate a second embodiment of the present invention. The initial process steps of this embodiment are the same as shown in FIGS. 3 through 5. After the formation of metal cap 34 as shown in FIG. 5, the silicidation step is skipped, and a carbonization is performed to form metal carbide cap 40. The process gases and the process conditions may be essentially the same as in the carbonization process shown in FIGS. 7A and 7B. In an embodiment as shown in FIG. 8A, metal cap 34 is fully carbonized, and thus metal carbide cap 40 substantially directly contacts copper line 32. Preferably, no copper line 32 is carbonized. Alternatively, as shown in FIG. 8B, only a top portion of the metal cap layer 34 is carbonized, and thus the resulting structure includes metal carbide cap 40 located on metal cap 34.

In alternative embodiments, metal carbide caps 40 as shown in FIGS. 8A and 8B are metal carbonitride caps. Accordingly, a nitridation needs to be performed. Similar to the embodiments discussed in the preceding paragraphs, the nitridation may be performed before, after, or simultaneously with the carbonization process, and may be performed using essentially the same process conditions.

In the final structure, the metal carbide caps 38 (refer to FIGS. 7A and 7B) and 40 (refer to FIGS. 8A and 8B) have thicknesses of greater than about 15 Å, and more preferably between about 35 Å and about 95 Å.

Figure 9:
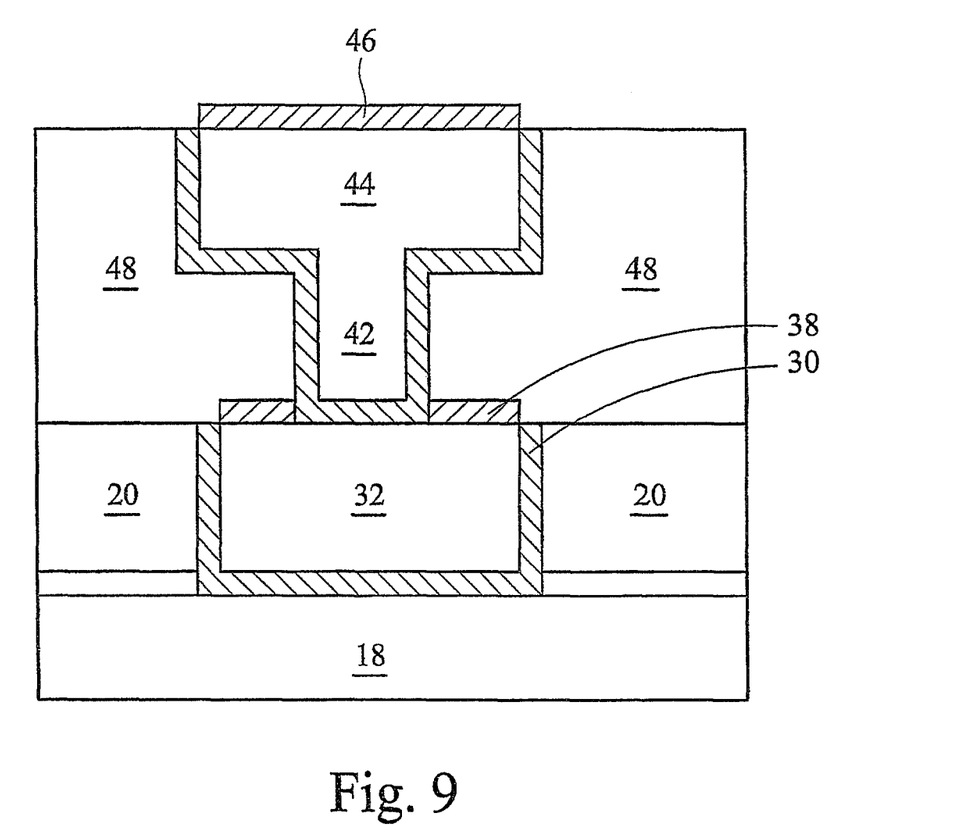
FIG. 9 illustrates an embodiment of the present invention, wherein a metal carbide cap layer is formed on a dual damascene structure.

In the preceding paragraphs, single damascene processes are discussed. One skilled in the art will realize that the teaching is readily available for dual damascene processes. FIG. 9 illustrates a dual damascene embodiment, which includes via 42 and the overlying copper line 44 in low-k dielectric layer 48. Using essentially the same process steps as discussed in the preceding paragraphs, metal carbide layer 46 may be formed. Please note that cap layers 38 or 40 (refer to FIGS. 7A through 8B) have high resistivities, and thus via 42 preferably penetrates cap 38 (or 40), and is in contact with copper line 32.

The embodiments of the present invention have several advantageous features. Metal carbide caps are more resistive to oxygen and chemical attacks. Therefore, the metal carbide caps and the underlying copper lines are more stable. Accordingly, the contact resistances between the copper lines and overlying vias are reduced, which further causes the improvement in yield. Experiments have been conducted to form samples using the embodiments of the present invention. It has been found that the samples have one hundred percent yield. In addition, since the metal carbide caps contain the same elements, such as carbon, as in the overlying ESL or low-k dielectric layers, the bondability between them is improved. Further advantageous features of the present invention include improved RC delay, reduced leakage currents, reduced electro-migration, and reduced stress-migration.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a first low-k dielectric layer over a semiconductor substrate, the first low-k dielectric layer having a first upper surface and a first lower surface;
   a conductive wiring in the first low-k dielectric layer, the conductive wiring having a second upper surface and a second lower surface, the second upper surface substantially coplanar with the first upper surface, the second lower surface substantially coplanar with the first lower surface, the conductive wiring having a first sidewall opposing a second sidewall, a first portion of the first low-k dielectric layer adjacent to the first sidewall, a second portion of the first low-k dielectric layer adjacent to the second sidewall, the first low-k dielectric layer comprising a first substantially homogeneous material;
   a metal carbide cap layer over the conductive wiring;
   a second low-k dielectric layer over the metal carbide cap layer; and
   a conductive via in the second low-k dielectric layer, the conductive via having a third sidewall opposing a fourth sidewall;
   wherein:
      the conductive via penetrates an opening in the metal carbide cap layer;
      a contact portion of the conductive via is in physical contact with the conductive wiring, the contact portion of the conductive via comprising a material that is different than material of the metal carbide cap layer;
      the third sidewall is disposed in and adjacent to the second low-k dielectric layer;
      the fourth sidewall is disposed in and adjacent to the second low-k dielectric layer;
      the second low-k dielectric layer comprises a second substantially homogeneous material;
      a contact interface between the first low-k dielectric layer and the second low-k dielectric layer does not comprise an etch stop layer;
      the first low-k dielectric layer has a first dielectric constant of less than about 3.0; and
      the second low-k dielectric layer has a second dielectric constant of less than about 3.0.

2. The integrated circuit structure of claim 1, wherein the metal carbide cap layer contacts the conductive wiring.

3. The integrated circuit structure of claim 1 further comprising a metal cap layer between and adjoining the metal carbide cap layer and the conductive wiring, wherein the metal carbide cap layer and the metal cap layer comprise same metals.

4. The integrated circuit structure of claim 1, wherein the metal carbide cap layer comprises a metal carbonitride.

5. The integrated circuit structure of claim 1, wherein the metal carbide cap layer comprises a metal silicon carbide.

6. The integrated circuit structure of claim 5, wherein the metal carbide cap layer comprises a metal silicon carbonitride.

7. The integrated circuit structure of claim 1, wherein the metal carbide cap layer comprises iron carbide.

8. The integrated circuit structure of claim 1, wherein the metal carbide cap layer comprises iron carbonitride.

9. The integrated circuit structure of claim 1, wherein the metal carbide cap layer comprises carbides of materials selected from the group consisting essentially of tungsten, tantalum, iron, cobalt, nickel, molybdenum, titanium, CoWP, CoB, and combinations thereof.

10. An integrated circuit structure comprising:
a first low-k dielectric layer over a substrate;
an opening extending from a first top surface of the first low-k dielectric layer into the first low-k dielectric layer;
a barrier layer lining the opening;
a copper-containing conductive line in the opening and on the barrier layer, the copper-containing conductive line having a second top surface substantially coplanar with the first top surface, the copper-containing conductive line having a first sidewall and a second sidewall, the first sidewall opposing the second sidewall, a first portion of the first low-k dielectric layer adjacent to the first sidewall, a second portion of the first low-k dielectric layer adjacent to the second sidewall;
a copper carbide cap over the second top surface;
a second low-k dielectric layer over the copper carbide cap, the second low-k dielectric layer in physical contact with the first low-k dielectric layer, a contact region between the first low-k dielectric layer and the second low-k dielectric layer not comprising an etch stop layer; and
a conductive via in the second low-k dielectric layer, the conductive via penetrating the second low-k dielectric layer and the copper carbide cap, wherein a contact portion of the conductive via is in direct physical contact with the copper-containing conductive line, the contact portion comprising a material different than material of the copper carbide cap.

11. The integrated circuit structure of claim 10, wherein the copper carbide cap contacts the copper-containing conductive line.

12. The integrated circuit structure of claim 10 further comprising a metal cap layer between the copper carbide cap and the copper-containing conductive line, wherein the metal cap layer and the copper carbide cap comprise same metals.

13. The integrated circuit structure of claim 10, wherein the copper carbide cap has a thickness of between about 35 Å and about 95 Å.

14. An integrated circuit structure comprising:
a first low-k dielectric layer over a semiconductor substrate, the first low-k dielectric layer having a first top surface;
a copper line in the first low-k dielectric layer, the copper line having a second top surface substantially coplanar with the first top surface, the copper line having a first sidewall and a second sidewall, the first sidewall opposing the second sidewall, a first portion of the first low-k dielectric layer adjacent to the first sidewall, a second portion of the first low-k dielectric layer adjacent to the second sidewall;
a metal cap layer over the copper line;
a metal carbonitride layer on the metal cap layer;
a second low-k dielectric layer over the metal carbonitride layer, a region interposing the first low-k dielectric layer and the second low-k dielectric layer not comprising an etch stop layer; and
a conductive via in the second low-k dielectric layer; wherein:
a portion of the conductive via penetrates an opening in the metal carbonitride layer and the metal cap layer, the portion of the conductive via penetrating the opening comprising a material different than material of the metal carbonitride layer and the metal cap layer; and
the metal cap layer and the metal carbonitride layer comprise same metals.

15. The integrated circuit structure of claim 14, wherein the metal cap layer and the metal carbonitride layer comprise iron.

16. The integrated circuit structure of claim 14, wherein the metal carbonitride layer comprises metal silicon carbonitride.

17. The integrated circuit structure of claim 2, wherein the metal carbide cap layer physically contacts the conductive wiring.

18. The integrated circuit structure of claim 11, wherein the copper carbide cap physically contacts the copper-containing conductive line.

19. The integrated circuit structure of claim 14, wherein the metal cap layer contacts the copper line.

20. The integrated circuit structure of claim 19, wherein the metal cap layer physically contacts the copper line.

* * * * *